United States Patent
Cheng et al.

(10) Patent No.: US 9,053,269 B1
(45) Date of Patent: Jun. 9, 2015

(54) SYSTEM AND METHODS FOR OPC MODEL ACCURACY MANAGEMENT AND DISPOSITION

(71) Applicant: GLOBALFOUNDRIES Singapore Pte. Ltd., Singapore (SG)

(72) Inventors: Yong Wah Jacky Cheng, Singapore (SG); Andrew Ker Ching Khoh, Clifton Park, NY (US); Yee Mei Foong, Singapore (SG); Gek Soon Chua, Singapore (SG)

(73) Assignee: GLOBALFOUNDRIES SINGAPORE PTE. LTD., Singapore ( * ) Notice: Subject to any disclaimer, the term of this patent is extended or adjusted under 35 U.S.C. 154(b) by 0 days.

(21) Appl. No.: 14/144,491

(22) Filed: Dec. 30, 2013

(51) Int. Cl.
   *G06F 17/50* (2006.01)

(52) U.S. Cl.
   CPC .................. *G06F 17/5045* (2013.01)

(58) Field of Classification Search
   CPC ........ G03F 1/36; G03F 1/144; G03F 7/70625
   USPC .......................................................... 716/53
   See application file for complete search history.

(56) References Cited

U.S. PATENT DOCUMENTS

2007/0111112 A1 * 5/2007 Huh et al. .................. 430/5

* cited by examiner

*Primary Examiner* — Jack Chiang
*Assistant Examiner* — Brandon Bowers
(74) *Attorney, Agent, or Firm* — Horizon IP Pte. Ltd.

(57) ABSTRACT

System and methods for OPC model accuracy and disposition using quad matrix are presented. A method includes obtaining wafer data from a calibration test pattern. The method also classifies the wafer data into four quadrants of a quad matrix. The method further utilizes at least one of the four quadrants to quantify OPC model accuracy.

19 Claims, 10 Drawing Sheets

SYSTEM AND METHODS FOR OPC MODEL ACCURACY MANAGEMENT AND DISPOSITION

BACKGROUND

Optical proximity correction (OPC) is a photolithography enhancement technique commonly used to compensate for image errors due to diffraction or process effects. OPC is often used for the fabrication of semiconductor devices due to the limitations of light to maintain the edge placement integrity of the original design, after processing, into the etched image on the silicon wafer. The projected images tend to appear with irregularities such as line widths that are narrower or wider than designed, and such irregularities are amenable to compensation by changing the pattern on the photomask used for imaging. Other distortions such as rounded corners are driven by the resolution of the optical imaging tool and are harder to compensate for. Such distortions, if not corrected for, may significantly alter the electrical properties of what was being fabricated. OPC corrects these errors by moving edges or adding extra polygons to the pattern written on the photomask. This may be driven by pre-computed look-up tables based on width and spacing between features (known as rule based OPC) or by using compact models to dynamically simulate the final pattern and thereby drive the movement of edges, typically broken into sections, to find the best solution, (this is known as model based OPC). The objective is to reproduce, as well as possible, the original layout drawn by the designer in the silicon wafer. Thus, OPC model accuracy is critical for advanced nodes.

Presently there are generally two approaches to quantifying OPC model accuracy, namely the physical approach and the simulation approach. Under the physical approach, empirical data from the wet and dry systems are fitted to models which are generated with specific numerical aperture (NA), source shape and exposure systems. Ambient components, such as air and water at a certain refractive index (e.g., 1.43), are transposed along with the measured empirical data to confirm the model accuracy. Under the simulation approach, model accuracy depends on several factors, primarily the intrinsic ability to represent the patterning trends through target size, pitch, and pattern shape for one-dimensional and two-dimensional structures at a given process condition. Also, calibration test pattern design coverage is important whenever model accuracy is in question, and this tends to be a problem. Further, root mean square (RMS) metric is used for simulation.

SUMMARY

Embodiments generally relate to OPC model accuracy management and disposition using quad matrix. In one embodiment, a method is disclosed. The method includes obtaining wafer data from a calibration test pattern. The method also classifies the wafer data into four quadrants of a quad matrix. The method further utilizes at least one of the four quadrants to quantify OPC model accuracy.

In one embodiment, another method is provided. The method includes quantifying OPC model accuracy. In quantifying OPC model accuracy, the method selects an OPC model at least by simulation with quad matrix management, creates a photomask based at least in part on the selected OPC model, performs wafer verification, and verifies lithography performance.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following.

DETAILED DESCRIPTION

Embodiments of the present disclosure generally relate to system for OPC model accuracy management. More particularly, some embodiments relate to OPC model accuracy management and disposition using quad matrix. OPC model accuracy is critical for advanced nodes. Typically, in quantifying OPC model accuracy, both the physical approach and the simulation approach are employed.

Figure 1:
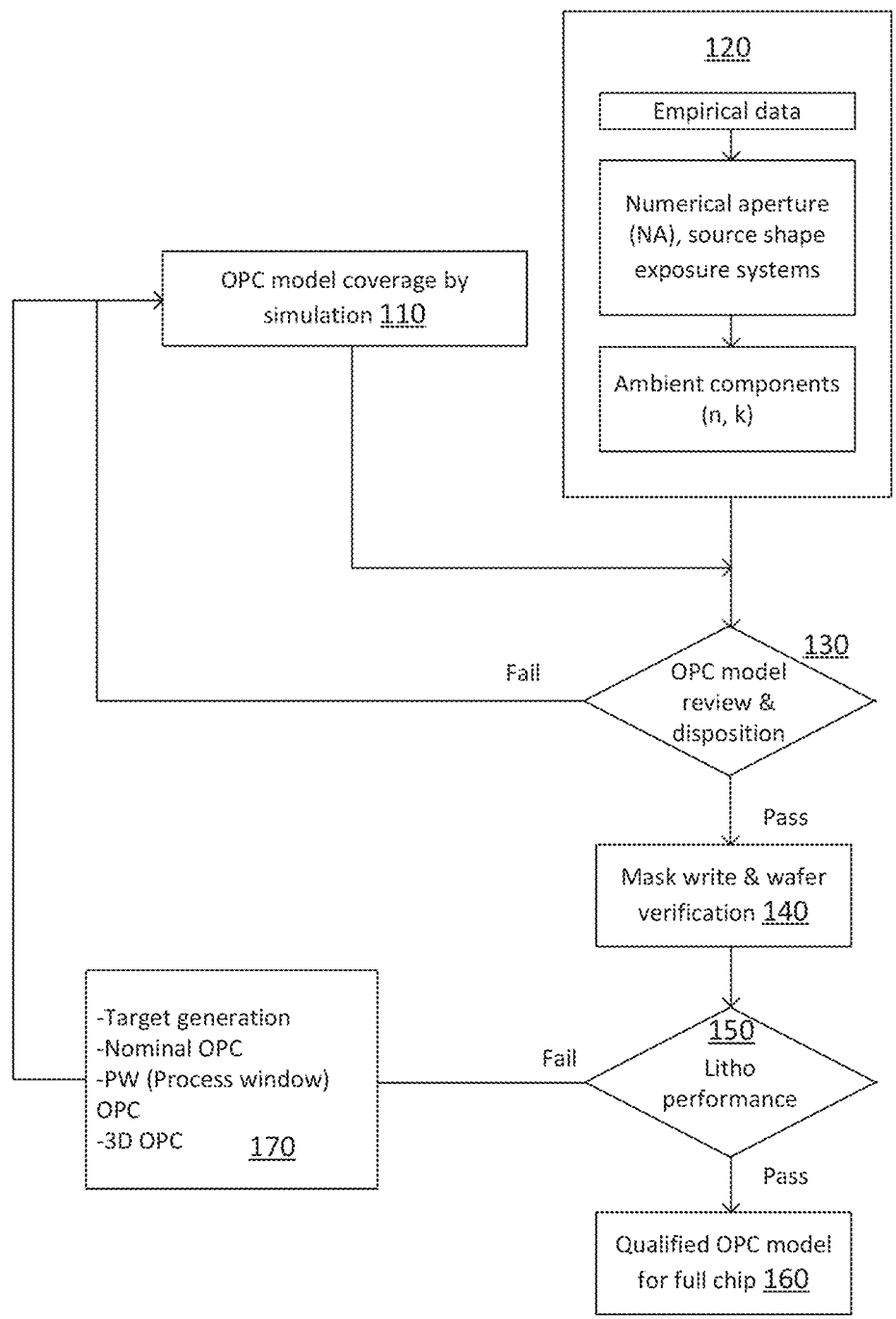
FIG. 1 shows a conventional process of quantifying OPC model accuracy and disposition.

FIG. 1 shows a conventional flow of a process 100 of quantifying OPC model accuracy and disposition. At 110, the simulation approach is performed for OPC model accuracy and disposition, and RMS metric is used for simulation. At 120, the physical approach is performed, such that empirical data are fitted to models which are generated with specific NA, source shape and exposure systems, and that ambient components are transposed along with the measured empirical data to confirm the model accuracy. After 110 and 120, the process 100 proceeds to 130. At 130, OPC model review and disposition is performed to determine whether a given OPC model either passes or fails the review. If the disposition is that the OPC model fails the review, the process 100 returns to 110 for further simulation. If the disposition is that the OPC model passes the review, the process 100 proceeds to 140. At 140, one or more masks based on the OPC model are produced and wafer verification is performed. At 150, lithography performance is either determined to be acceptable or unacceptable. If the lithography performance is acceptable, the process 100 proceeds to 160 where the OPC model is qualified for full chip production. If, however, the lithography performance is unacceptable, the process 100 proceeds to 170. At 170, various tasks are carried out, including the generation of a defined target, nominal OPC, process window (PW) OPC and three-dimensional (3D) OPC. After 170, the process 100 returns to 110 where simulation is carried out.

Figure 2:
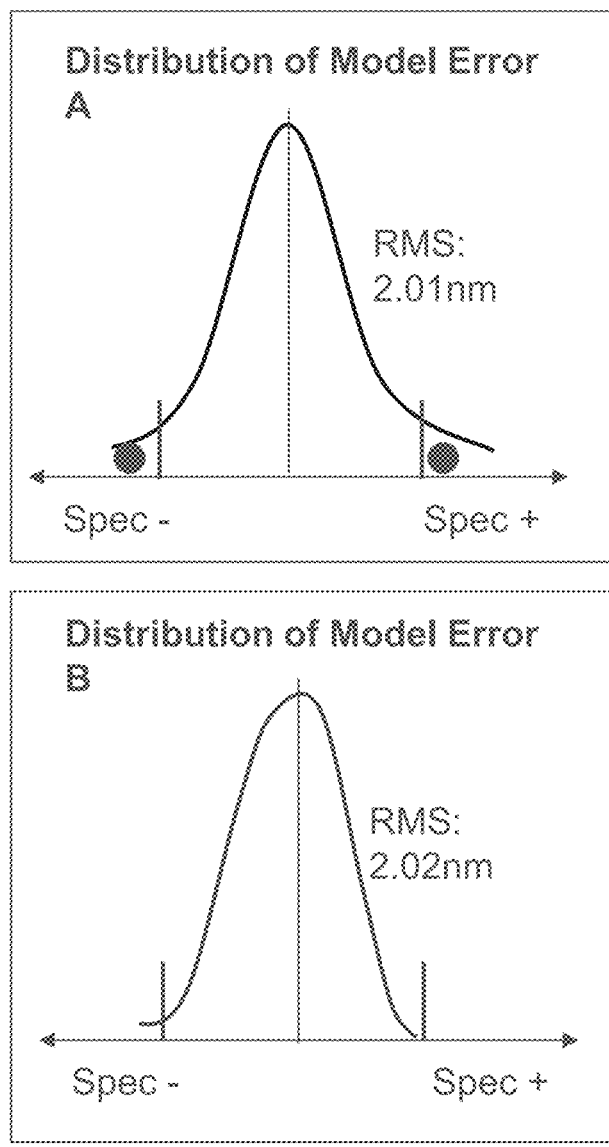
FIG. 2 shows distributions of model error using the conventional process of quantifying OPC model accuracy and disposition of FIG. 1.

FIG. 2 shows distributions of model error using the conventional process of quantifying OPC model accuracy and disposition of FIG. 1. In particular, FIG. 2 shows known relevant existing solution. Generally, OPC model accuracy is judged by the RMS of the model error. For example, the following equation may be used in the calculation:

$$RMS = \sqrt{\frac{1}{N-1}\sum_{i=1}^{N}(CD_{Wafer,i} - CD_{Model,i})^2}.$$

As shown in FIG. 2, the RMS between model A (the top chart) and model B (the bottom chart) is very close, with the RMS of model A being 2.01 nm and the RMS of model B being 2.02 nm. However, in model A, some data with slightly bigger model error are not significantly represented by RMS, i.e., the two circles on the two ends of the bell curve, and this is undesirable.

Figure 3:
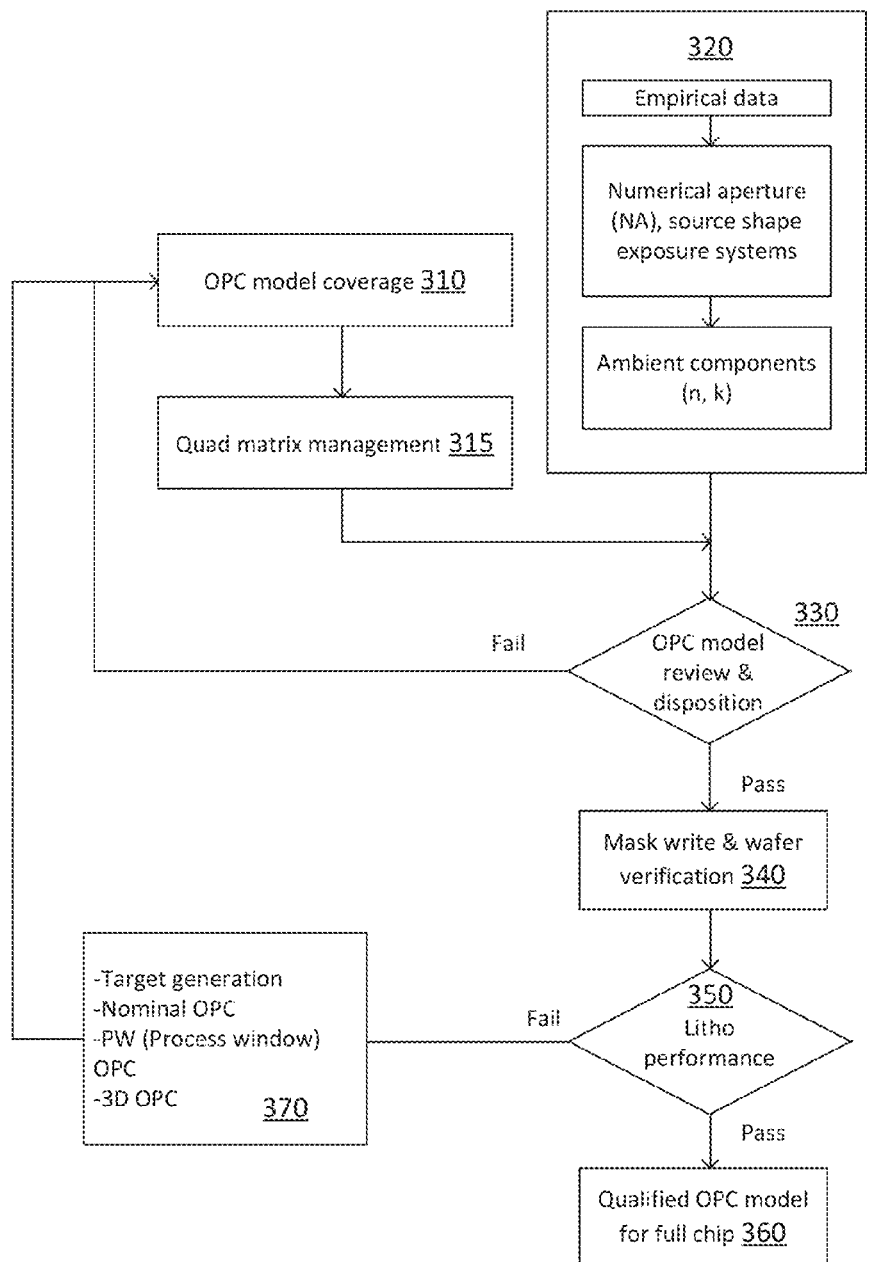
FIG. 3 shows a process of quantifying OPC model accuracy and disposition with quad matrix management in accordance with an embodiment of the present disclosure.

FIG. 3 shows a process 300 of quantifying OPC model accuracy and disposition with quad matrix management in accordance with an embodiment of the present disclosure. At 310, the simulation approach is performed for OPC model accuracy and disposition, and RMS metric is used for simulation. At 320, the physical approach is performed. The process 300 differs from the process 100 in that, after 310, the process 300 proceeds to 315 where quad matrix management in accordance with the present disclosure is performed. Specifically, quad matrix management using a quad matrix, such as that shown in FIG. 4 to be described below, is performed to find one or more of the following: the best OPC model, one or more real weak points, and the best measurement number.

After 315 and 320, the process 300 proceeds to 330. At 330, OPC model review and disposition is performed to determine whether a given OPC model either passes or fails the review. If the disposition is that the OPC model fails the review, the process 300 returns to 310 for further simulation. If the disposition is that the OPC model passes the review, the process 300 proceeds to 340. At 340, one or more masks based on the OPC model are produced and wafer verification is performed. At 350, lithography performance is either determined to be acceptable or unacceptable. If the lithography performance is acceptable, the process 300 proceeds to 360 where the OPC model is qualified for full chip production. If, however, the lithography performance is unacceptable, the process 300 proceeds to 370. At 370, various tasks are carried out as with 170 in process 100. After 370, the process 300 returns to 310 where simulation is carried out.

Figure 4:
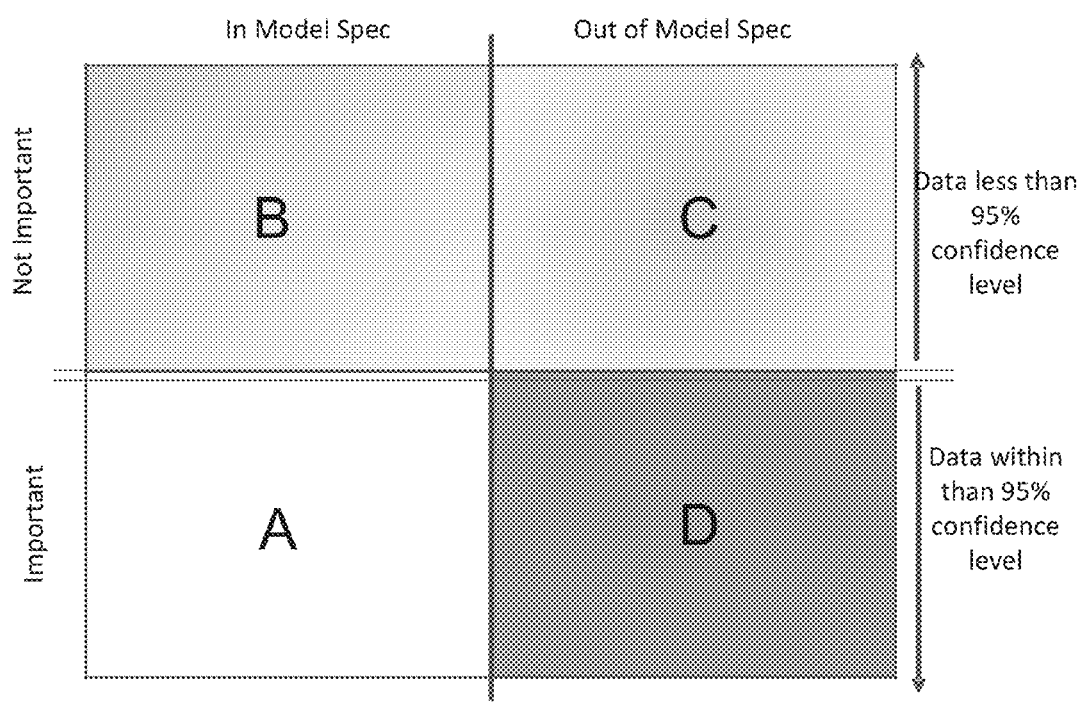
FIG. 4 shows four quadrants of a quad matrix for quad matrix management in accordance with an embodiment of the present disclosure.

FIG. 4 shows four quadrants of a quad matrix 400 for quad matrix management in accordance with an embodiment of the present disclosure. As shown in FIG. 4, the quad matrix 400 has four quadrants, namely quadrant A on the lower-left hand corner, quadrant B on the upper-left hand corner, quadrant C on the upper-right hand corner, and quadrant D on the lower-right hand corner. Data points from simulation of the OPC model in 310 of process 300 are mapped onto the four quadrants of the quad matrix 400. Data points that fall in quadrant A are data that are important but not urgent, e.g., items that are important but do not require immediate attention, and need to be planned for. Data points that fall in quadrant B are data that are unimportant and not urgent, e.g., items that do not have to be done anytime soon and, perhaps, add little or no value, and should be minimized or eliminated. Data points that fall in quadrant C are data points that are urgent but unimportant data, e.g., items that should be minimized or eliminated. Data points that fall in quadrant D are data that are important and urgent, e.g., items that need to be dealt with immediately. The focus of quad matrix management in accordance with the present disclosure focuses on quadrant D.

Figure 5:
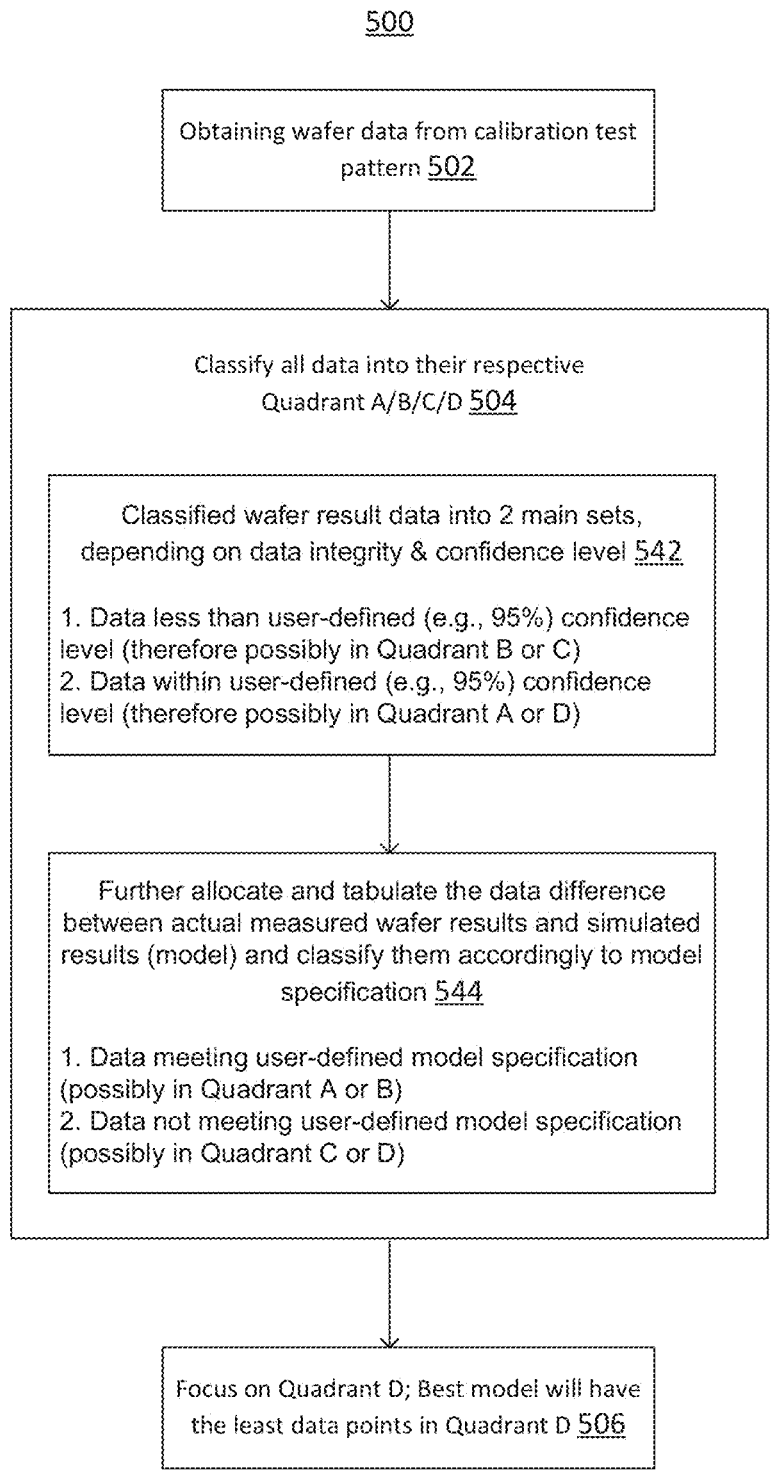
FIG. 5 shows a process of quad matrix management in accordance with an embodiment of the present disclosure.

FIG. 5 shows a process 500 of quad matrix management in accordance with an embodiment of the present disclosure. At 502, the process 500 obtains wafer data from a calibration test pattern. At 504, the process 500 classifies the wafer data into four quadrants of a quad matrix, such as the quad matrix 400 of FIG. 4 for example. At 506, the process 500 utilizes at least one of the four quadrants to quantify OPC model accuracy. For example, at 506, the process 500 may focus on quadrant D of the quad matrix 400 to identify the OPC model with the least number of data points in quadrant D, which is deemed the best model. In classifying the wafer data into four quadrants at 504, the process 500 may perform one or more operations such as, for example, operations 542 and 544.

At 542, the process 500 may classify the wafer data into two sets of data based at least on data integrity and confidence level. The two sets of data may include one set of data with a confidence level less than a user-defined confidence level and another set of data with a confidence level within the user-defined confidence level. For example, the set of data with a confidence level less than the user-defined confidence level, e.g., 95%, may possibly fall in quadrant B or C of the quad matrix 400 of FIG. 4, and the set of data with a confidence level within the user-defined confidence level may possibly fall in quadrant A or D of the quad matrix 400.

At 544, the process 500 may classify the wafer data into two sets of data based at least on a user-defined model specification. The two sets of data may include one set of data meeting the user-defined model specification and another set of data not meeting the user-defined model specification. For example, the set of data meeting the user-defined model specification may possibly fall in quadrant A or B of the quad matrix 400 of FIG. 4, and the set of data not meeting the user-defined model specification may possibly fall in quadrant C or D of the quad matrix 400.

The four quadrants into which the process 500 classifies the wafer data may include the following: a first quadrant for a first portion of the wafer data that is within a user-defined confidence level and meets a user-defined model specification (e.g., quadrant A of the quad matrix 400); a second quadrant for a second portion of the wafer data that is less than the user-defined confidence level and meets the user-defined model specification (e.g., quadrant B of the quad matrix 400); a third quadrant for a third portion of the wafer data that is less than the user-defined confidence level and does not meet the user-defined model specification (e.g., quadrant C of the quad matrix 400); and a fourth quadrant for a fourth portion of the wafer data that is within the user-defined confidence level and does not meet the user-defined model specification (e.g., quadrant D of the quad matrix 400).

In utilizing at least one of the four quadrants to quantify OPC model accuracy at 506, the process 500 may perform at least one of the following operations: identifying a best model; identifying one or more weak points in the wafer data; or identifying a best number of measurement.

In identifying a best model, the process 500 may compare at least two models and select one of the at least two models that has fewer data points in the fourth quadrant than other models of the at least two models as the best model.

In identifying one or more weak points in the wafer data, the process 500 may identify one or more data points that fall in the fourth quadrant as the one or more weak points.

In identifying a best number of measurement, the process 500 may determine a number of measurement that results in a level of uncertainty below a user-defined level of uncertainty.

Figure 6:
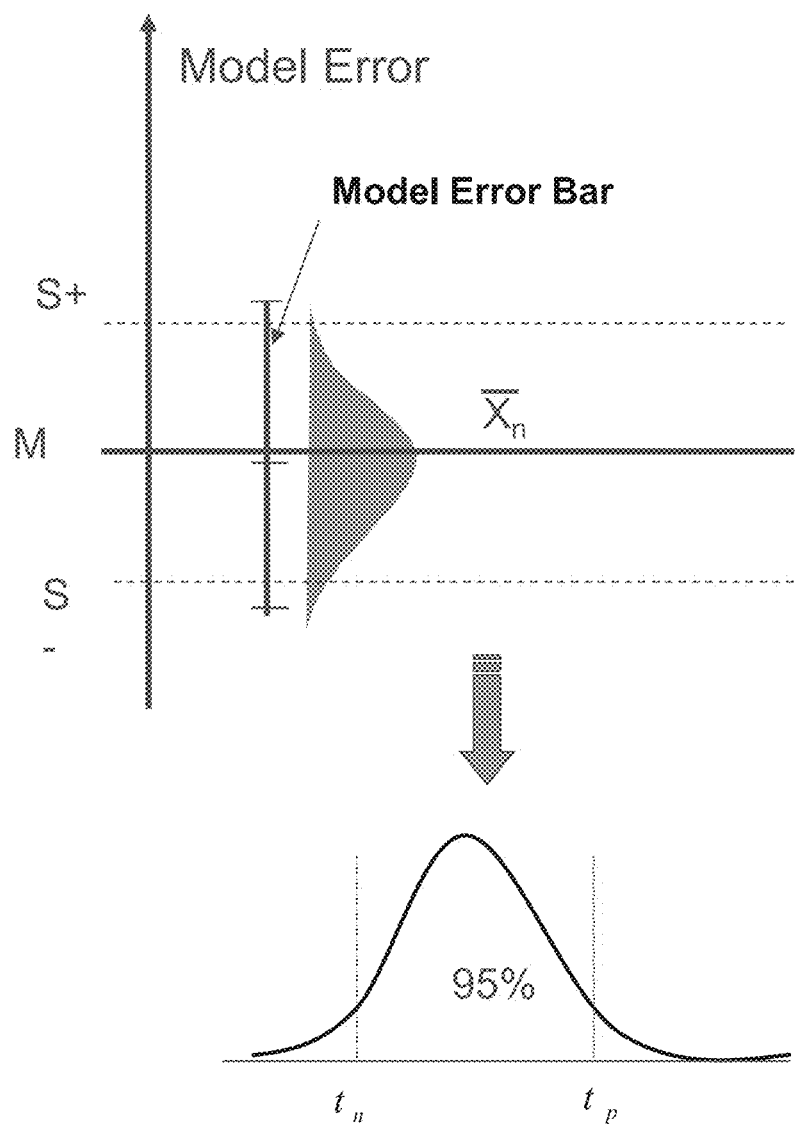
FIG. 6 shows charts related to computation of a confidence level in accordance with an embodiment of the present disclosure.

FIG. 6 shows charts related to computation of a confidence level in accordance with an embodiment of the present disclosure. The computation of confidence level depends on model specification, measurement sigma and number of dies (samples). An example computation is shown below.

$$S_+ = (100\% + Y) * \overline{X}_n$$

$$S_- = (100\% - Y) * \overline{X}_n$$

$$P(S_+ > \mu > S_-) = 0.95$$

$$P(-S_+ < -\mu < -S_-) = 0.95$$

$$P\left(\frac{\overline{X}_n - S_+}{S_n/\sqrt{n}} < \frac{\overline{X}_n - \mu}{S_n/\sqrt{n}} < \frac{\overline{X}_n - S_-}{S_n/\sqrt{n}}\right) = 0.95$$

$$P\left(\frac{\overline{X}_n - S_+}{S_n/\sqrt{n}} < T < \frac{\overline{X}_n - S_-}{S_n/\sqrt{n}}\right) = 0.95$$

$$P\left(\frac{-Y\% * \overline{X}_n}{S_n/\sqrt{n}} < T < \frac{Y\% * \overline{X}_n}{S_n/\sqrt{n}}\right) = 0.95$$

$$P(t_{-0.025} < T < t_{0.025}) = 0.95$$

$$S_+ = (100\% + Y) * \overline{X}_n$$

$$S_- = (100\% - Y) * \overline{X}_n$$

In the above equations, $S_+$ defines the upper specification, $S_-$ defines the lower specification, and Y defines the specification in percentage in relation to measured critical dimension (CD). In one example, when the user-defined confidence level is 95%:

$$P(S_+ > \mu > S_-) = 0.95$$

$$P(-S_+ < -\mu < -S_-) = 0.95$$

A confidence interval is the range of values within which the population mean is most likely to fall. In the example case where the user-defined confidence level is 95% (i.e., 95% confidence interval), if independent samples are taken repeatedly from the same population, with a confidence interval calculated for each sample, then it can be deemed that the confidence level is 95% that the true value of the parameter is in the confidence interval.

If, however, independent samples are taken repeatedly from different n populations with different X CD values, then confidence intervals are calculated as follows:

$$P\left(\frac{\overline{X}_n - S_+}{S_n/\sqrt{n}} < \frac{\overline{X}_n - \mu}{S_n/\sqrt{n}} < \frac{\overline{X}_n - S_-}{S_n/\sqrt{n}}\right) = 0.95$$

Translating to Student's t-distribution, where $\overline{X}_n$ is the sample mean, and $S_n$ is the sample variance:

$$T = \frac{\overline{X}_n - \mu}{S_n/\sqrt{n}}$$

Setting the specification as Y % of CD values:

$$P\left(\frac{-Y\% * \overline{X}_n}{S_n/\sqrt{n}} < T < \frac{Y\% * \overline{X}_n}{S_n/\sqrt{n}}\right) = 0.95$$

$$P(t_{-0.025} < T < t_{0.025}) 0.95$$

There is a 2.5% chance that T will be less than $t_{-0.025}$ and a 2.5% chance that T will be larger than $t_{+0.025}$. Thus, the probability that T will be between $t_{-0.025}$ and $t_{+0.025}$ is 95%.

Figure 7:
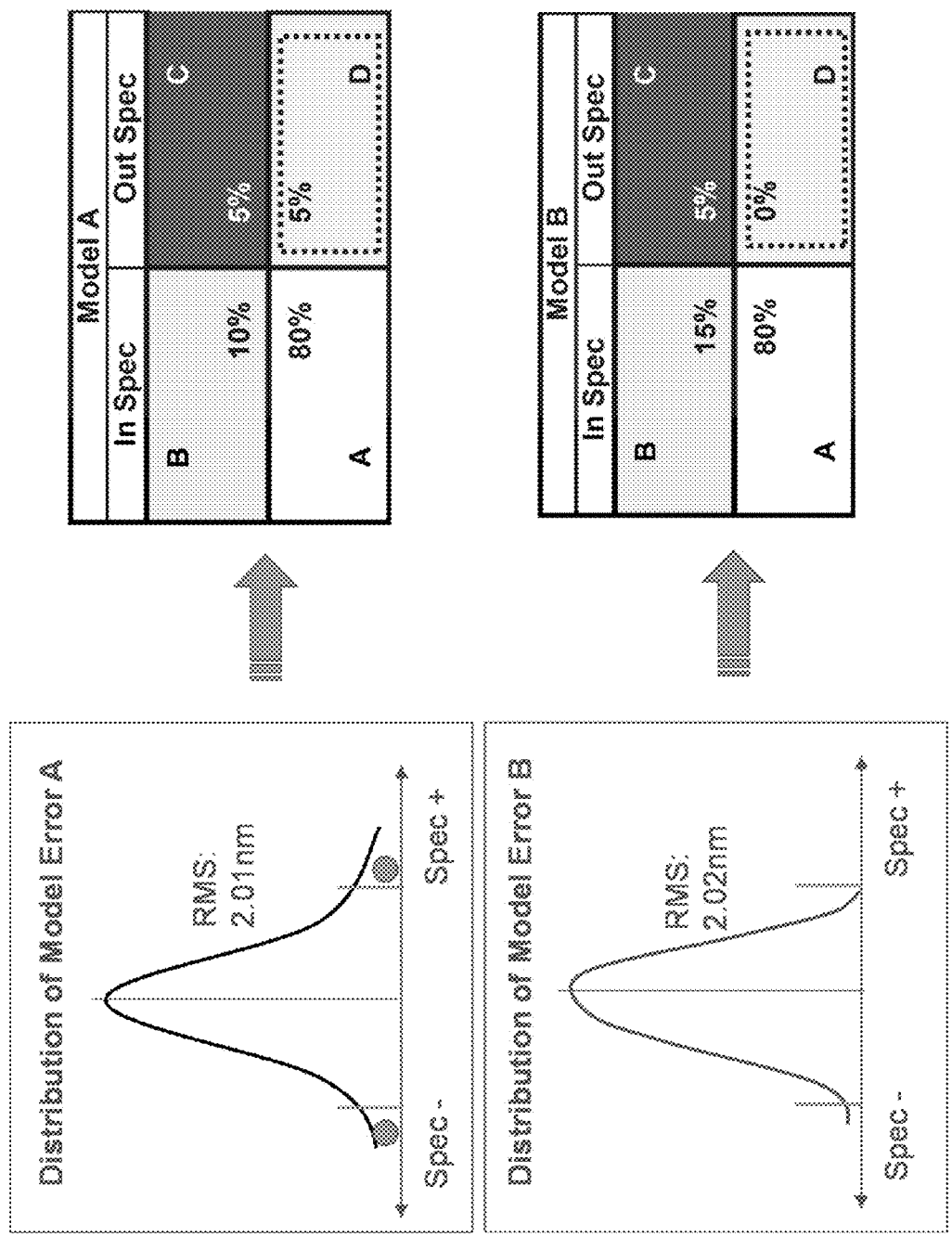
FIG. 7 shows an example of finding a best model with quad matrix management in accordance with an embodiment of the present disclosure.

FIG. 7 shows an example of finding a best model with quad matrix management in accordance with an embodiment of the present disclosure. As shown in FIG. 7, under model A, 5% of data points falls in quadrant D of the quad matrix 400 of FIG. 5, and, under model B, there is 0% of the data points in quadrant D. Given that the model with the least number of data points in quadrant D is deemed the best model, in the example shown in FIG. 7 model B appears to be the best model.

Figure 8:
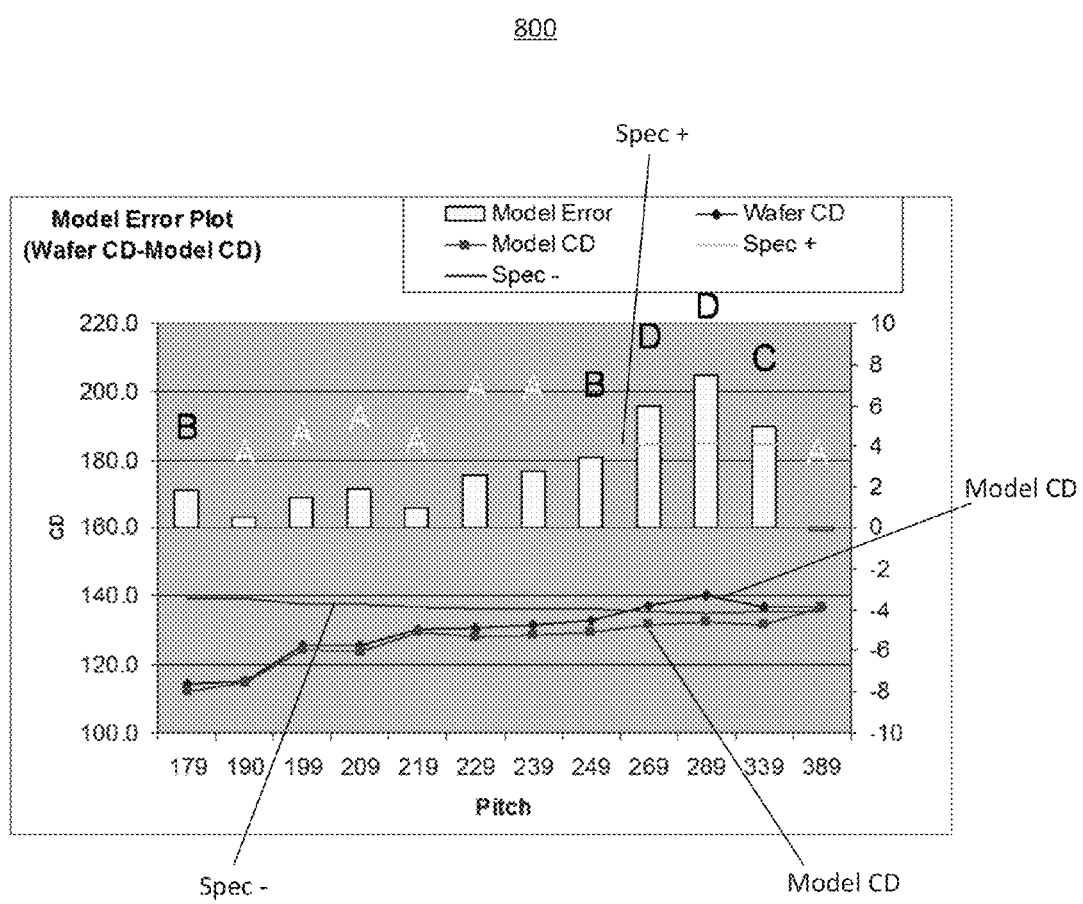
FIG. 8 shows an example of finding one or more weak points with quad matrix management in accordance with an embodiment of the present disclosure.

FIG. 8 shows an example of finding one or more weak points with quad matrix management in accordance with an embodiment of the present disclosure. As shown in FIG. 8, two of the out-of-specification data points are capped with "D" and mapped to quadrant D of the quad matrix 400 of FIG. 4. These "D" data points are statistically confident or safe for further improvement, and are considered as the weak points.

Figure 9:
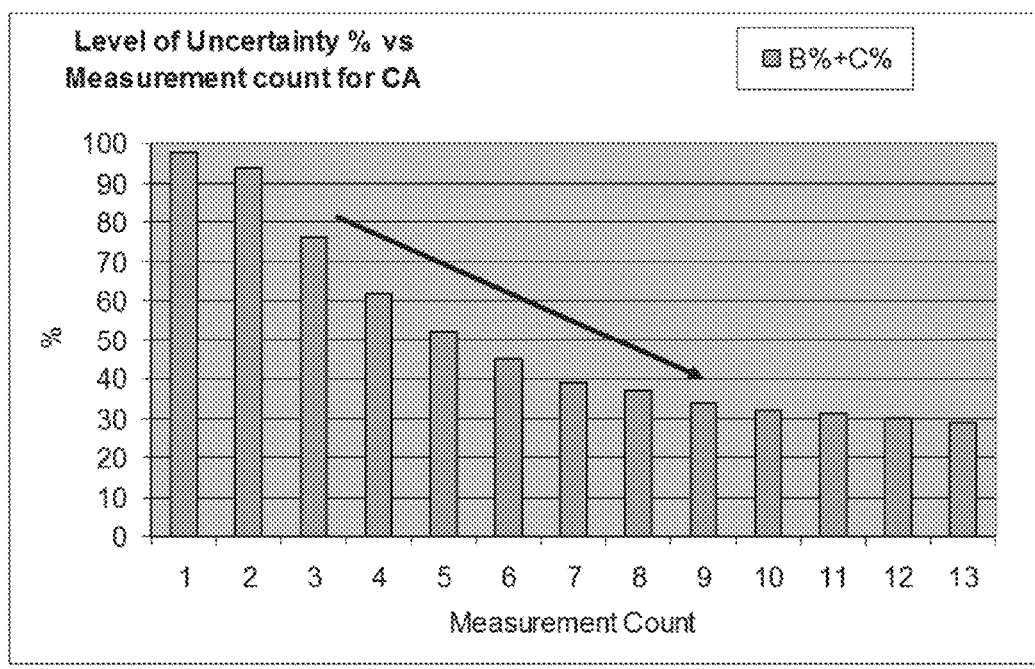
FIG. 9 shows an example of finding a best number of measurement with quad matrix management in accordance with an embodiment of the present disclosure.

FIG. 9 shows an example of finding a best number of measurement with quad matrix management in accordance with an embodiment of the present disclosure. In the example shown in FIG. 9, the current measurement count is three (3) dies for conformity assessment (CA). The quad matrix analysis in accordance with the present disclosure shows that, by increasing the measurement count, the level of uncertainty is reduced.

In view of the above, it can be seen that the proposed scheme of quantifying OPC model accuracy and disposition with quad matrix management in accordance with the present disclosure provides a number of potential advantages over conventional approaches. Firstly, benchmarking of various models quantitatively is possible with the proposed scheme. Secondly, early insight into process limitations of prospective ground rules for early technology development may be gained. Thirdly, by focusing on quadrant D of the quad matrix, the real weak points of a given model can be identified for improvement. Additionally, the best number of measurement can be determined by using the quad matrix analysis to reduce the level of uncertainty. Moreover, the proposed scheme positively impacts the OPC model accuracy in terms of quality since, without implementation of the proposed scheme and if poor wafer convergence is found after mask write and wafer print, the cost would increase ten times.

Figure 10:
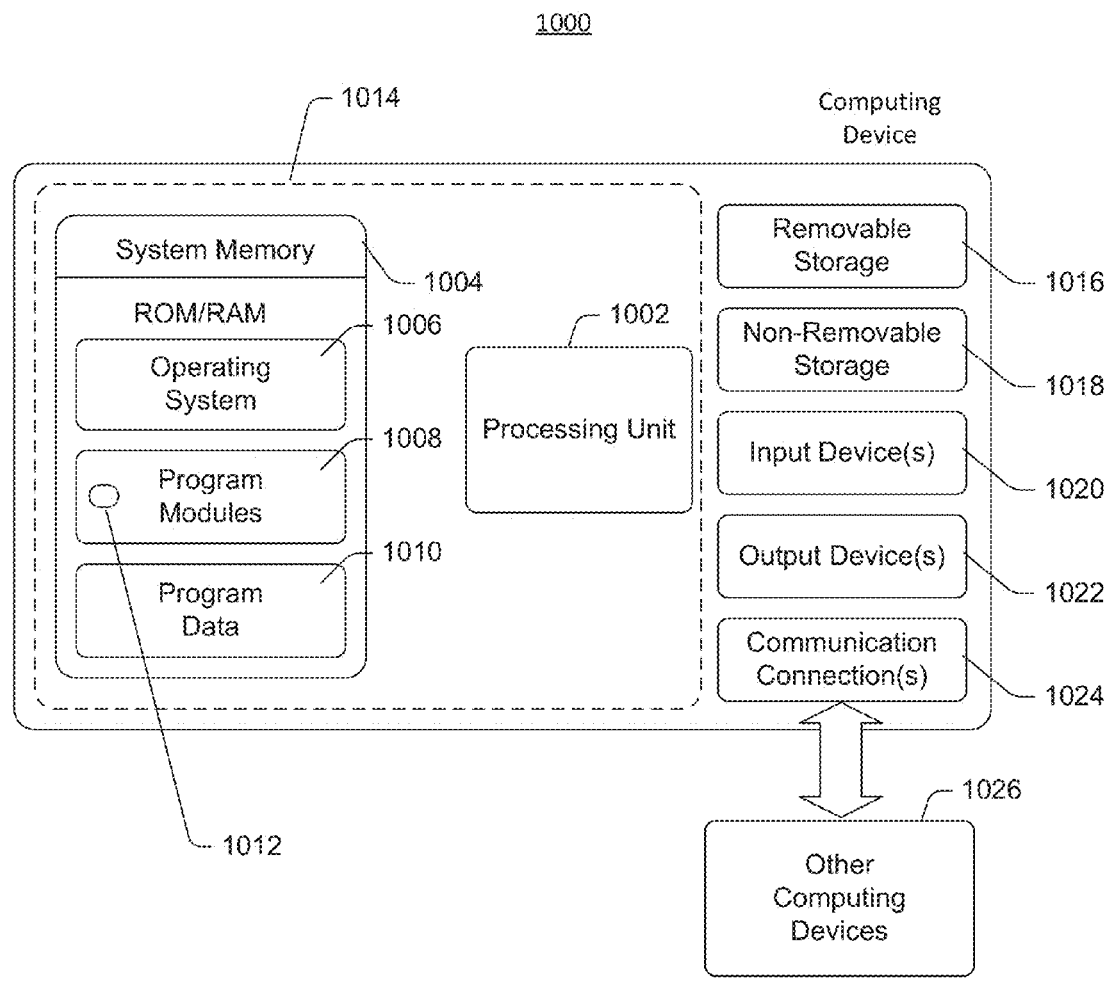
FIG. 10 shows an example computing device that implements quad matrix management in accordance with an embodiment of the present disclosure.

FIG. 10 shows an example computing device 1000 that implements quad matrix management in accordance with an embodiment of the present disclosure. However, it will be readily appreciated that the techniques disclosed herein may be implemented in other computing devices, systems, and environments. The computing device 1000 shown in FIG. 10 is only one example of a computing device and is not intended to suggest any limitation as to the scope of use or functionality of the computer and network architectures.

In at least one configuration, computing device 1000 typically includes at least one processing unit 1002 and system memory 1004. Depending on the exact configuration and type of computing device, system memory 1004 may be volatile (such as RAM), non-volatile (such as ROM, flash memory, etc.) or some combination thereof. System memory 1004 may include an operating system 1006, one or more program modules 1008, and may include program data 1010. The computing device 1000 is of a very basic configuration demarcated by a dashed line 1014. Again, a terminal may have fewer components but may interact with a computing device that may have such a basic configuration.

In one embodiment, the program module 1008 includes quad matrix management module 1012. The quad matrix management module 1012 can carry out one or more functionalities and processes as described above with reference to FIG. 5 or any variations thereof. For example, when the quad matrix management module 1012 is properly configured, the computing device 1000 can carry out the operations of process 500 of FIG. 5 and variations thereof.

Computing device 1000 may have additional features or functionality. For example, computing device 1000 may also include additional data storage devices (removable and/or non-removable) such as, for example, magnetic disks, optical disks, or tape. Such additional storage is illustrated in FIG. 10 by removable storage 1016 and non-removable storage 1018. Computer storage media may include volatile and nonvolatile, removable and non-removable media implemented in any method or technology for storage of information, such as computer readable instructions, data structures, program modules, or other data. System memory 1004, removable storage 1016 and non-removable storage 1018 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 1000. Any such computer storage media may be part of the computing device 1000. Computing device 1000 may also have input device(s) 1020 such as keyboard, mouse, pen, voice input device, touch input device, etc. Output device(s) 1022 such as a display, speakers, printer, etc. may also be included.

Computing device 1000 may also contain communication connections 1024 that allow the device to communicate with other computing devices 1026, such as over a network. These networks may include wired networks as well as wireless networks. Communication connections 1024 are some examples of communication media. Communication media may typically be embodied by computer readable instructions, data structures, program modules, etc.

It is appreciated that the illustrated computing device 1000 is only one example of a suitable device and is not intended to suggest any limitation as to the scope of use or functionality of the various embodiments described. Other well-known computing devices, systems, environments and/or configurations that may be suitable for use with the embodiments include, but are not limited to personal computers, server computers, hand-held or laptop devices, multiprocessor systems, microprocessor-based systems, set top boxes, game consoles, programmable consumer electronics, network PCs, minicomputers, mainframe computers, distributed computing environments that include any of the above systems or devices, and/or the like.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for generating a mask used in lithographic processes to form a semiconductor device on a wafer, the method comprising:
    employing a computer for performing quad matrix management to quantify optical proximity correction (OPC) model accuracy comprising
        obtaining wafer data from a calibration test pattern,
        classifying the same wafer data obtained from the calibration test pattern into four quadrants of a quad matrix, and
        utilizing one of the four quadrants to quantify OPC model accuracy; and
    creating a photomask after performing the quad matrix management.

2. The method of claim 1, wherein classifying the wafer data into four quadrants comprises:
    classifying the wafer data into two sets of data based at least on data integrity and confidence level.

3. The method of claim 2, wherein the two sets of data comprise one set of data with a confidence level less than a user-defined confidence level and another set of data with a confidence level within the user-defined confidence level.

4. The method of claim 2, wherein classifying the wafer data into four quadrants further comprises:
    classifying the wafer data into two sets of data based at least on a user-defined model specification.

5. The method of claim 4, wherein the two sets of data comprise one set of data meeting the user-defined model specification and another set of data not meeting the user-defined model specification.

6. The method of claim 1, wherein the four quadrants comprise:
    a first quadrant for a first portion of the wafer data that is within a user-defined confidence level and meets a user-defined model specification;
    a second quadrant for a second portion of the wafer data that is less than the user-defined confidence level and meets the user-defined model specification;
    a third quadrant for a third portion of the wafer data that is less than the user-defined confidence level and does not meet the user-defined model specification; and
    a fourth quadrant for a fourth portion of the wafer data that is within the user-defined confidence level and does not meet the user-defined model specification.

7. The method of claim 1, wherein utilizing one of the four quadrants to quantify OPC model accuracy comprises at least one of the following:
    identifying a best model;
    identifying one or more weak points in the wafer data; or
    identifying a best number of measurement.

8. The method of claim 7, wherein identifying a best model comprises:
    comparing at least two models; and
    selecting one of the at least two models that has fewer data points in the fourth quadrant than other models of the at least two models as the best model.

9. The method of claim 7, wherein identifying one or more weak points in the wafer data comprises:
identifying one or more data points that fall in the fourth quadrant as the one or more weak points.

10. The method of claim 7, wherein identifying a best number of measurement comprises:
determining a number of measurement that results in a level of uncertainty below a user-defined level of uncertainty.

11. A method comprising:
quantifying optical proximity correction (OPC) model accuracy by performing operations comprising:
selecting an OPC model at least by performing quad matrix management which comprises
obtaining wafer data from a calibration test pattern,
classifying the same wafer data obtained from the calibration test pattern into four quadrants of a quad matrix, and
utilizing one of the four quadrants to quantify OPC model accuracy;
creating a photomask based at least in part on the selected OPC model after performing the quad matrix management;
performing wafer verification; and
verifying lithography performance.

12. The method of claim 11, wherein utilizing one of the four quadrants to quantify OPC model accuracy comprises identifying a best model.

13. The method of claim 11, wherein classifying the wafer data into four quadrants comprises:
classifying the wafer data into first two sets of data based at least on data integrity and confidence level; and
classifying the wafer data into second two sets of data based at least on a user-defined model specification.

14. The method of claim 13, wherein the first two sets of data comprise one set of data meeting the user-defined model specification and another set of data not meeting the user-defined model specification, and wherein the second two sets of data comprise one set of data meeting the user-defined model specification and another set of data not meeting the user-defined model specification.

15. The method of claim 11, wherein the four quadrants comprise:
a first quadrant for a first portion of the wafer data that is within a user-defined confidence level and meets a user-defined model specification;
a second quadrant for a second portion of the wafer data that is less than the user-defined confidence level and meets the user-defined model specification;
a third quadrant for a third portion of the wafer data that is less than the user-defined confidence level and does not meet the user-defined model specification; and
a fourth quadrant for a fourth portion of the wafer data that is within the user-defined confidence level and does not meet the user-defined model specification.

16. The method of claim 11, wherein utilizing one of the four quadrants to quantify OPC model accuracy comprises at least one of the following:
identifying a best model;
identifying one or more weak points in the wafer data; or
identifying a best number of measurement.

17. The method of claim 16, wherein identifying one or more weak points in the wafer data comprises:
identifying one or more data points that fall in the fourth quadrant as the one or more weak points.

18. The method of claim 16, wherein identifying a best number of measurement comprises:
determining a number of measurement that results in a level of uncertainty below a user-defined level of uncertainty.

19. A method comprising:
quantifying optical proximity correction (OPC) model accuracy by performing operations comprising:
selecting an OPC model at least by simulation with quad matrix management which comprises
obtaining wafer data from a calibration test pattern,
classifying the wafer data into four quadrants of a quad matrix
utilizing at least one of the four quadrants to quantify the OPC model accuracy which comprises identifying a best model, wherein identifying the best model comprises
comparing at least two models, and
selecting one of the at least two models that has less data points in the fourth quadrant than other models of the at least two models as the best model;
creating a photomask based at least in part on the selected OPC model;
performing wafer verification; and
verifying lithography performance.

* * * * *